(12) United States Patent
Devin

(10) Patent No.: US 7,068,538 B2
(45) Date of Patent: Jun. 27, 2006

(54) MEMORY CIRCUIT WITH NON-VOLATILE IDENTIFICATION MEMORY AND ASSOCIATED METHOD

(75) Inventor: Jean Devin, Le Tholonet (FR)

(73) Assignee: STMicroelectronics, S.A., Montrouge (FR)

( * ) Notice: Subject to any disclaimer, the term of this patent is extended or adjusted under 35 U.S.C. 154(b) by 111 days.

(21) Appl. No.: 10/921,365

(22) Filed: Aug. 18, 2004

(65) Prior Publication Data

US 2005/0078503 A1    Apr. 14, 2005

(30) Foreign Application Priority Data

Aug. 18, 2003  (FR)  ................................. 03 09987

(51) Int. Cl.
*G11C 16/04*  (2006.01)
(52) U.S. Cl. .................. 365/185.04; 365/201; 365/195
(58) Field of Classification Search ........... 365/185.04, 365/201, 195
See application file for complete search history.

(56) References Cited

U.S. PATENT DOCUMENTS

| | | | |
|---|---|---|---|
| 5,099,451 A * | 3/1992 | Sourgen et al. ........... | 365/185.2 |
| 5,553,019 A | 9/1996 | Sandvos et al. ....... | 365/185.04 |
| 6,034,889 A * | 3/2000 | Mani et al. ............ | 365/185.04 |
| 6,456,542 B1 * | 9/2002 | Roohparvar ........... | 365/189.12 |

FOREIGN PATENT DOCUMENTS

| | | |
|---|---|---|
| DE | 43 40 027 | 6/1995 |
| EP | 1 143 455 | 10/2001 |

OTHER PUBLICATIONS

French Preliminary Search Report dated Apr. 19, 2004 for French Application No. 03 09987.

* cited by examiner

*Primary Examiner*—Tuan T. Nguyen
(74) *Attorney, Agent, or Firm*—Lisa K. Jorgenson; Jon A. Gibbons; Fleit, Kain, Gibbons, Gutman, Bongini & Bianco P.L.

(57) ABSTRACT

A memory circuit comprising a memory area for storing data, a non-volatile memory area for storing at least one identification code, and a pin for storing the identification code in the non-volatile memory area. The memory circuit further comprising a programmable register in which a programmable state is fixed, wherein the programmable state indicates if the identification code has been stored in the non-volatile memory area, and a logic module which blocks any subsequent changes to the identification code fixed in the non-volatile memory area in response to the programmable state in the programmable register indicating that the identification code has been stored in the non-volatile area. The invention also relates to an associated method. The invention is useful particularly to avoid fraudulent reprogramming of the area containing the identification code. The invention also relates to an associated method.

20 Claims, 1 Drawing Sheet

MEMORY CIRCUIT WITH NON-VOLATILE IDENTIFICATION MEMORY AND ASSOCIATED METHOD

CROSS-REFERENCE TO RELATED APPLICATIONS

This application is based upon and claims priority from prior French Patent Application No. 03 09987, filed on Aug. 18, 2003 the entire disclosure of which is herein incorporated by reference.

FIELD OF THE INVENTION

The present invention generally relates to memory circuits and more specifically to memory circuits comprising a non-volatile memory area for entering identification codes.

BACKGROUND OF THE INVENTION

Non-volatile memories with a memory area for storing an identification code are known. The memory area is typically programmed at the end of a memory test to identify it uniquely such as manufacturing data. This memory area can typically be programmed through the use of a programming pin. The circuit in the non-volatile memory area is designed to only transmit a single programming command to the memory area such that the stored code is not normally modified.

Although non-volatile memories with a memory area for storing an identification code are useful, they have their shortcomings and disadvantages. One disadvantage is the storage memory area used to store an identification code is relatively easily to be reprogrammed. This relative ease of reprogramming many times is for fraudulent purposes such as using the memory device in an unauthorized application.

Accordingly, a need exists for a memory circuit and associated method that overcomes the above shortcomings and disadvantages of non-volatile memories with areas for storing identification codes.

SUMMARY OF THE INVENTION

Briefly, in accordance with the present invention, a memory circuit comprising a memory area for storing data and a non-volatile memory area for storing at least one identification code is disclosed. The memory circuit further comprises a pin for storing the identification code in the non-volatile memory area and a programmable register in which a programmable state is fixed. The programmable state indicates if the identification code has been stored in the non-volatile memory area. The memory circuit further comprises a logic module which blocks any subsequent changes to the identification code fixed in the non-volatile memory area in response to the programmable state in the programmable register indicating that the identification code has been stored in the non-volatile area. The invention is useful, particularly to avoid fraudulent reprogramming of the area containing the identification code.

According to one embodiment, the pin is a programming pin. The register can be programmed once only and the state of the register indicates if the identification code storage memory area is programmed. Subsequently, the logic module blocks any further programming of the storage memory area when the register indicates that the memory area is already programmed.

According to one embodiment, the useful memory area is non-volatile.

According to yet another embodiment, the useful memory area, the identification code storage area, and the register are EEPROM memory cells.

According to yet another embodiment, the register can be programmed once only and it is composed of a floating grid transistor for which the drain and the source are not powered by an erase voltage.

According to yet another embodiment, the register can be programmed once only and is composed of a floating grid transistor for which the grid is not powered by an erase voltage.

It should be understood, in one embodiment, that the circuit in the present invention is also fitted with an AND logic circuit, in which there are two inputs, one connected to the register and the other to the state fixation pin, and the output of which is connected to a terminal for fixing the state of the identification code storage memory area.

Further in accordance with the present invention, a memory circuit comprises a useful memory area, a memory area for storage of at least one identification code, and a register for which the state may be fixed once only. The method comprises:

forming a memory circuit with a memory area for storing data, a non-volatile memory area for storage of at least one identification code, and a programmable register with a programmable state which indicates if the identification code has been stored in the non-volatile memory area;

storing an identification code in the non-volatile memory area; and fixing a programmable state in the programmable register so as to block any subsequent modification of the identification code stored therein.

According to one embodiment, the register can be programmed once only, and the marker entered in it is a programmed state marker.

According to another embodiment, the method also includes a step to test the useful memory area before entering the identification code.

BRIEF DESCRIPTION OF THE DRAWING

The subject matter, which is regarded as the present invention, is particularly pointed out and distinctly claimed in the claims at the conclusion of the specification. The foregoing and other features, and advantages of the present invention will be apparent from the following detailed description taken in conjunction with the accompanying drawing in which:

DESCRIPTION OF THE PREFERRED EMBODIMENTS

Figure 1:
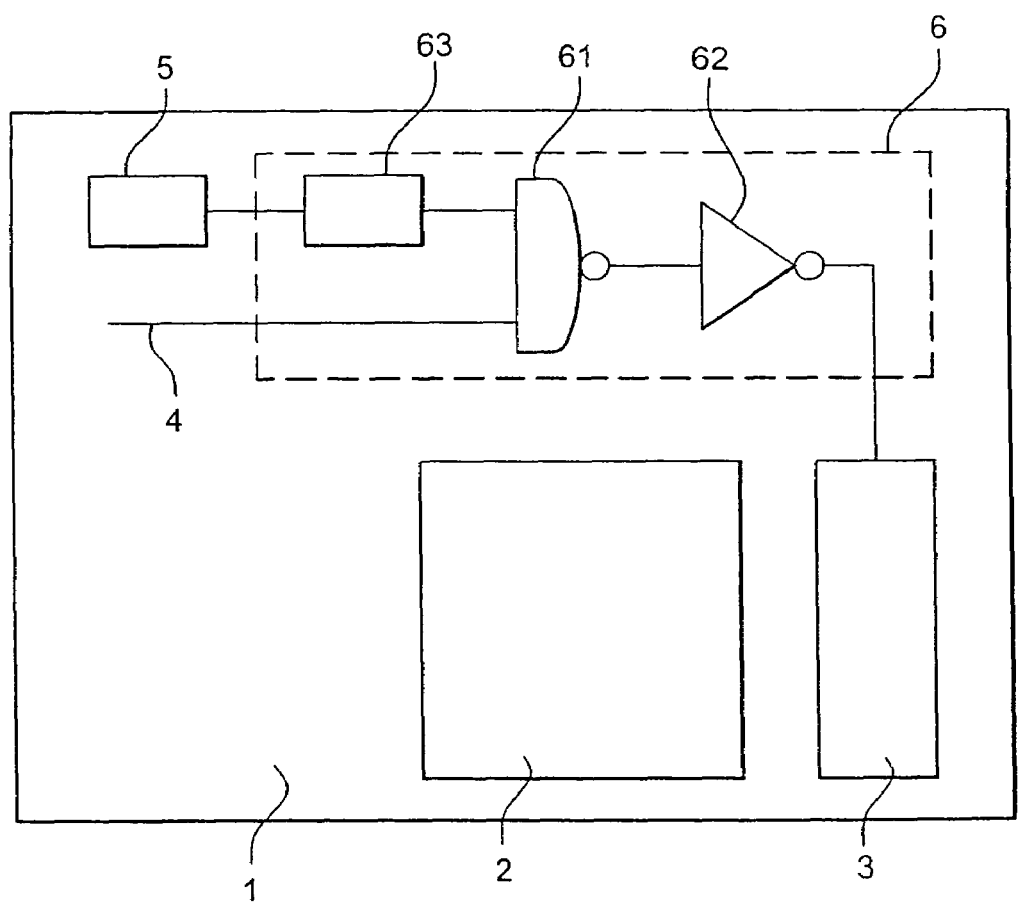
FIG. 1 is a diagram of an example memory circuit 1 according to the present invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The present invention proposes to use a register for which the state can only be fixed once to memorize fixing the state of the identification code memory area and to block subsequent attempts to fix the state.

The present invention will be described in the following in the most general case of fixing the state. The text between parentheses corresponds to the special case illustrated in which fixing the state includes selective programming of memory cells. According to one alternative, the state fixation used could obviously be a selective erase of memory cells.

FIG. 1 diagrammatically shows an example memory circuit 1 according to the present invention. The memory circuit 1 comprises a useful memory area 2 intended for the storage of useful data. The memory circuit 1 also comprises a non-volatile memory area for storage of at least one identification code 3.

For example, the identification code may be a code entered after a test step of the memory circuit 1, at the end of the manufacturing process. In particular, this identification code may be a code uniquely identifying the circuit, a code identifying circuit production conditions or a code that can be used for encryption operations on useful data in the memory circuit.

The memory circuit 1 also comprises a state fixation pin 4 (in this case a programming pin) for the identification code storage memory area 3. This pin 4 is designed to enable at least one step to fix the state (in this case a programming step) of the storage memory area 3.

The memory circuit 1 also comprises a programmable register 5, for which the state can only be fixed once (programmable once only), storing a state indicating if the state of the identification code storage memory area 3 has been fixed (this state indicates if the memory area 3 has been programmed). The register typically includes a state corresponding to a memory area 3 for which the state has not been fixed (the memory area 3 has not been programmed) and another state corresponding to a memory area 3 for which the state has been fixed (the memory area 3 has been programmed). 1 bit is sufficient to memorize whether or not the state of the memory area 3 has been fixed.

The memory circuit 1 also comprises a logic module 6 making it impossible to fix the state (in this case programming) of the memory area 3 when the programmable register 5 indicates that the state of this memory area 3 has been fixed (in this case when this memory area 3 has been programmed).

Once the state of the memory area 3 has been fixed (when the memory area has been programmed), the programmable register 5 is also fixed. Since the state of programmable register 5 can only be fixed (programmed) once, any attempt to fix the state (programming) of the memory area 3 later will be blocked. An erroneous or fraudulent attempt to fix the state (programming) of the memory area 3 is then efficiently avoided.

The present invention is advantageously applicable to a memory circuit in which the useful memory area 2 is non-volatile. The protected memory area 3 then certifies the contents of the useful memory area 2. The memory area 2 may in particular be composed of an EEPROM memory, a Flash memory or a ferro-electric memory.

Advantageously, the useful memory area 2, the storage memory area 3 and the programmable register 5 are cells of an EEPROM memory or a Flash memory. It is relatively easy to make these different memory areas in the cells of a single memory of this type. Only minor modifications to the masks used to make this type of memory are necessary to make a memory circuit 1 according to the present invention.

The programmable register 5 is preferably composed of a floating grid transistor for which the drain and source do not have connections through which erasable voltages can be applied. It is thus possible to arrange for the source and the drain to be only connected to a programming and read voltage source. In the example of a Flash memory, it will be possible for the drain, substrate and source to be not connected to a floating grid electron extraction pump. The programmable register 5 may also be composed of a floating grid transistor for which the grid does not have connections through which an erase voltage could be applied to them. The transistor can then be programmed but cannot be erased to be reprogrammed. To fix the state by erasing, those skilled in the art will also be able to provide appropriate connections for the floating grid transistor to prevent it from being programmed. These embodiments are particularly suitable for the embodiment in which the different memory areas are EEPROM or Flash memory cells: simple modifications to manufacturing masks can eliminate these connections between an electrode of a floating grid transistor and a charging pump. These embodiments are particularly advantageous because it is extremely difficult to fraudulently modify such a memory circuit to supply power to the transistor electrodes so that they can be programmed or erased.

More generally, it is sufficient to make connections to electrodes of a floating grid transistor such that they make it possible to:
either add but not subtract electrons in the floating grid;
or subtract but not add electrons in the floating grid.

According to one preferred embodiment, the logic or blocking module 6 is made as follows: the module 6 includes an AND logic circuit with two inputs, one of which is connected to the programmable register 5 and the other to the pin 4. The output from the AND circuit is connected to a programming terminal for the memory area 3. An AND circuit with a small number of transistors is advantageously reduced by placing a logical NAND gate 61 and a NOT circuit 62 in series as illustrated in FIG. 1.

In the memory circuit 1 shown, a read circuit for the programmable register 5 is inserted between the programmable register 5 and the AND circuit.

In the example shown, it would be possible for the circuit 63 to output a logical signal equal to 1 when the programmable register 5 is blank, which corresponds to an unprogrammed memory area 3. Thus, when a request is applied to the pin 4 to fix the state (programming), it is validated by the AND circuit. After the state of memory area 3 has been fixed (programmed), the state of programmable register 5 will also be fixed (the register is programmed). The circuit 63 then outputs a logic signal equal to zero. Thus, when a request is applied to the pin 4 to fix a state (programming), it is invalidated by the AND circuit.

The method for use of memory circuit 1 may thus be as follows:

An identification code is entered in the identification memory area, a fixed (programmed) state marker is then entered in register 4, fixing (programming) the state of the identification memory area is then forbidden.

Entering the identification code may be preceded by a step to test in the useful memory area, for example at the end of the memory manufacturing process. The identification code may then contain data output from the results of the tests.

Although a specific embodiment of the present invention has been disclosed, it will be understood by those having skill in the art that changes can be made to this specific embodiment without departing from the spirit and scope of the present invention. The scope of the present invention is not to be restricted, therefore, to the specific embodiment, and it is intended that the appended claims cover any and all such applications, modifications, and embodiments within the scope of the present invention.

What is claimed is:

1. A memory circuit comprising:
   a memory area for storing data;
   a non-volatile memory area for storing at least one identification code;
   a pin for storing the identification code in the non-volatile memory area;
   a programmable register in which a programmable state is fixed, wherein the programmable state indicates if the identification code has been stored in the non-volatile memory area; and
   a logic module which blocks any subsequent changes to the identification code fixed in the non-volatile memory area in response to the programmable state in the programmable register indicating that the identification code has been stored in the non-volatile area.

2. The memory circuit of claim 1, wherein the programmable state fixed in the programmable register can only be fixed once.

3. The memory circuit according to claim 1, wherein
   the pin is a programming pin; and
   the programmable register can be fixed with the programmable state only once with a single bit value.

4. The memory circuit according to claim 1, wherein the memory area for storing data is non-volatile.

5. The memory circuit according to claim 3, wherein the memory area for storing data is non-volatile.

6. The memory circuit according to claim 1, wherein the memory area for storing data, the storage area for the identification code, and the programmable are one of EEPROM and flash memory cells.

7. The memory circuit according to claim 3, wherein the memory area for storing data, the storage area for the identification code, and the programmable are one of EEPROM and flash memory cells.

8. The memory circuit according to claim 5, wherein the memory area for storing data, the storage area for the identification code, and the programmable are one of EEPROM and flash memory cells.

9. The memory circuit according to claim 1, wherein the programmable register can be programmed once only and is composed of a floating grid transistor for which a drain and a source are not powered by an erase voltage.

10. The memory circuit according to claim 3, wherein the programmable register can be programmed once only and is composed of a floating grid transistor for which a drain and a source are not powered by an erase voltage.

11. The memory circuit according to claim 5, wherein the programmable register can be programmed once only and is composed of a floating grid transistor for which a drain and a source are not powered by an erase voltage.

12. The memory circuit according to claim 8, wherein the programmable register can be programmed once only and is composed of a floating grid transistor for which a drain and a source are not powered by an erase voltage.

13. The memory circuit according to claim 1, wherein the logic module further comprises an AND logic circuit with two inputs and an output, wherein one of the two inputs are electrically connected to the programmable register and a second of the two inputs are logically connected to the pin, and the output of the AND logic circuit is electrically connected to a terminal for storing the identification code in the non-volatile memory area.

14. The memory circuit according to claim 3, wherein the logic module further comprises an AND logic circuit with two inputs and an output, wherein one of the two inputs are electrically connected to the programmable register and a second of the two inputs are logically connected to the pin, and the output of the AND logic circuit is electrically connected to a terminal for storing the identification code in the non-volatile memory area.

15. The memory circuit according to claim 5, wherein the logic module further comprises an AND logic circuit with two inputs and an output, wherein one of the two inputs are electrically connected to the programmable register and a second of the two inputs are logically connected to the pin, and the output of the AND logic circuit is electrically connected to a terminal for storing the identification code in the non-volatile memory area.

16. The memory circuit according to claim 8, wherein the logic module further comprises an AND logic circuit with two inputs and an output, wherein one of the two inputs are electrically connected to the programmable register and a second of the two inputs are logically connected to the pin, and the output of the AND logic circuit is electrically connected to a terminal for storing the identification code in the non-volatile memory area.

17. A method for using a memory circuit, the method comprising:
    forming a memory circuit with a memory area for storing data, a non-volatile memory area for storage of at least one identification code, and a programmable register with a programmable state which indicates if the identification code has been stored in the non-volatile memory area;
    storing an identification code in the non-volatile memory area; and
    fixing a programmable state in the programmable register so as to block any subsequent modification of the identification code stored therein.

18. The method according to claim 17, wherein the programmable register can be programmed once only.

19. The method according to claim 17, further comprising:
    testing the memory area for storing data after forming the memory circuit and before storing the identification code in the non-volatile memory area.

20. The method according to claim 18, further comprising:
    testing the memory area for storing data after forming the memory circuit and before storing the identification code in the non-volatile memory area.

* * * * *

UNITED STATES PATENT AND TRADEMARK OFFICE
CERTIFICATE OF CORRECTION

PATENT NO. : 7,068,538 B2  Page 1 of 1
APPLICATION NO. : 10/921365
DATED : June 27, 2006
INVENTOR(S) : Jean Devin It is certified that error appears in the above-identified patent and that said Letters Patent is hereby corrected as shown below:

Column 5, line 33: after the word "programmable", add the word -- register --
Column 5, line 37, after the word "programmable", add the word -- register --
Column 5, line 41, after the word "programmable", add the word -- register --

Signed and Sealed this

Sixth Day of February, 2007

JON W. DUDAS
*Director of the United States Patent and Trademark Office*